(12) United States Patent
Song

(10) Patent No.: US 6,775,345 B1
(45) Date of Patent: Aug. 10, 2004

(54) DELAY LOCKED LOOP BASED DATA RECOVERY CIRCUIT FOR DATA COMMUNICATION

(75) Inventor: Hongjiang Song, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/475,497

(22) Filed: Dec. 30, 1999

(51) Int. Cl.[7] .............................. H03D 3/24; G06F 1/12
(52) U.S. Cl. ...................................... 375/376; 709/400
(58) Field of Search ................................ 375/376, 373; 341/100; 327/156; 713/400; 709/400

(56) References Cited

U.S. PATENT DOCUMENTS

| | | | |
|---|---|---|---|
| 4,926,447 A | * | 5/1990 | Corsetto et al. ............. 375/376 |
| 5,490,282 A | * | 2/1996 | Dreps et al. .................... 710/1 |
| 5,537,068 A | | 7/1996 | Konno |
| 5,602,884 A | * | 2/1997 | Wieczorkiewicz et al. .. 375/376 |
| 5,619,148 A | | 4/1997 | Guo |
| 5,621,774 A | | 4/1997 | Ishibashi et al. |
| 5,625,649 A | | 4/1997 | Ishizu |
| 5,689,533 A | | 11/1997 | Brauns et al. |
| 5,948,083 A | | 9/1999 | Gervasi |
| 6,033,441 A | * | 3/2000 | Herbert ....................... 709/400 |
| 6,075,387 A | * | 6/2000 | Urbansky ....................... 327/2 |
| 6,271,777 B1 | * | 8/2001 | Lentine et al. .............. 341/100 |
| 6,483,871 B1 | * | 11/2002 | Dawe ......................... 375/226 |
| 6,639,956 B1 | | 10/2003 | Song |

OTHER PUBLICATIONS

Chih–Kong Ken Yang, et al., "A 0/8–µm CMOS 2.5 Gb/s Oversampling Receiver and Transmitter for Serial Links", IEEE Journal of Solid–State Circuits, vol. 31, No. 12, Dec. 1996 (pp. 2015–2023).

* cited by examiner

Primary Examiner—Stephen Chin
Assistant Examiner—Lawrence Williams
(74) Attorney, Agent, or Firm—Blakely, Sokoloff, Taylor & Zafman LLP

(57) ABSTRACT

An apparatus including a sampling circuit to generate sampling clocks from a local clock and the sampling clocks to sample incoming data and a quarter clock, a phase detector to detect a phase difference between a data transition in sampled data and the local clock, and a delay line adapted to delay the sampled data by the detected phase difference.

21 Claims, 10 Drawing Sheets

DELAY LOCKED LOOP BASED DATA RECOVERY CIRCUIT FOR DATA COMMUNICATION

FIELD OF THE INVENTION

The invention relates to delay locked loop-based circuits, and in particular to delay locked loop-based circuits in data communication.

BACKGROUND

Circuits using phase locked loop (PLL) are widely used in data communications. An example of such a circuit may be a data recovery circuit. A PLL based circuit may be generally sufficient where power dissipation is not an issue even though communication speeds are high. In certain circuits, the communication speeds may range from 1 MHz to 100 GHz. In general, however, circuits operating at high speeds are sensitive to power dissipation that results in the overheating of the circuits. In circuits where power conservation is an issue, power dissipation is also problematic.

One commonly used method of reducing power dissipation is to place the circuit in "sleep mode" when not in use. In the sleep mode, the circuit is temporarily shut down until reactivated which is generally referred to as "wake up". For example, when no transmission is being received, the data recovery circuit places itself in a sleep mode. When a transmission is detected, the data recovery circuit wakes up to process the transmission. However, the PLL in the data recovery circuit generally requires a substantial acquisition time, perhaps in the order of 94 to 2000 cycles before the PLL can lock onto the incoming transmission. Therefore, to allow for the PLL lock, synchronizing signals of sufficient duration are transmitted before the actual transmission is transmitted. However, such synchronizing signals introduce latency to the overall data transfer speed, which is problematic in high-speed data communication. In one method, latency due to PLL acquisition time is minimized by transmitting synchronizing signals at predetermined intervals to the data recovery circuit during sleep mode thereby allowing the PLL to maintain lock. However, the transmitter circuit and the data recovery circuit are not fully in the sleep mode resulting in a constant power dissipation.

The PLL also has poor jitter tolerance in that being an analog device, which uses a voltage-controlled oscillator, the PLL inherently generates noise. Furthermore, the PLL of the data recovery circuit syncs with the transmitting clock to recover data. However, because the recovered data is not in sync with the recovery circuit clock, the data needs to be resynced using an additional re-timing circuit. As an additional problem, being an analog circuit, the PLL-based data recovery circuit is rather complicated and cannot be easily implemented in a CMOS fabrication process. Therefore, generally, two fabrication processes are performed. First, a CMOS fabrication process is performed to implement the digital circuits in the substrate. This is followed by a bipolar fabrication process to implement the analog circuits in the substrate. However, using two processes complicates the manufacturing process and is generally not cost efficient. In addition, PLL-based circuits are highly susceptible to the stray resistance and capacitance of the substrate. In many instances, the effects of the stray resistance and capacitance of the substrate are so severe that the characteristics of the original PLL design are altered. Thus, the PLL does not perform according to its specification. Due to this problem, the PLL design may not be readily scalable and may depend on the characteristics of the particular substrate in which the PLL is to be implemented.

Being an analog device and having additional circuitry such as a re-timing circuit, data recovery circuits based on PLL are generally large using large areas of the silicon substrate. Accordingly, it is desired to design a data communication circuit that does not require an analog circuitry like the PLL and overcomes the shortcomings described above.

SUMMARY

In accordance with the invention, there is disclosed an apparatus including a sampling circuit to generate sampling clocks from a local clock and the sampling clocks to sample incoming data and a quarter clock, a phase detector to detect a phase difference between a data transition in sampled data and the local clock, and a delay line adapted to delay the sampled data by the detected phase difference.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

When used in a data recovery scheme, in one embodiment, the data recovery circuit uses a controlled digital delay line to adaptively compensate for incoming data phase error using an over-sampling sigma delta modulation algorithm. Such configuration ensures the phase of the data at the output of the delay line to be in sync with the data recovery circuit clock (i.e., local reference clock as opposed to the transmitting clock). Thus, a DLL-based data recovery circuit does not require additional data sync operation as in the PLL-based scheme. In this manner, a DLL-based data recovery circuit achieves very short acquisition time when compared to the acquisition time of the PLL. Further, a DLL-based data recovery circuit has relatively short latency, which may be as short as 4–10 clock cycles, including elastic buffering. Further, the data recovery scheme is highly jitter tolerant. Thus, from above, it can be seen that these features make the DLL data recovery scheme very suitable for various low power and high-speed applications.

The scheme may be implemented using a digital-based analog (DBA) design approach, which utilizes analog functions using digital circuits based on certain digital signal processing (DSP) algorithms. The DBA approach makes the circuit implementation highly scalable and allows the circuit to be directly integrated onto a digital-based chip without degrading its reliability, manufacturability and testability. Various embodiments will be described to aid in the understanding of the invention and should not be construed as limitations to the invention.

Figure 1:
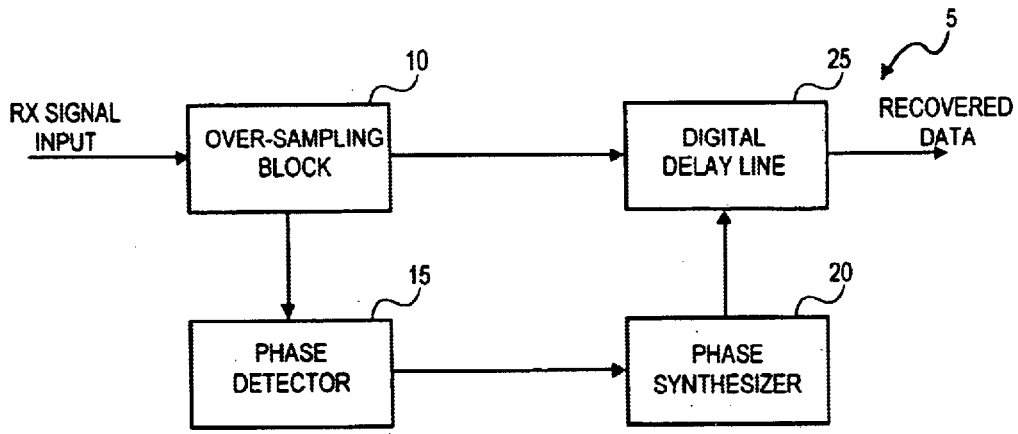
FIG. 1 is a schematic diagram of a Delay Locked Loop (DLL) based data recovery circuit in accordance with an embodiment of the invention.

FIG. 1 is a schematic diagram of a Delay Locked Loop (DLL) based data recovery circuit 5 in accordance with an embodiment of the invention. As shown in the figure, the data recovery circuit comprises over-sampling (OS) block 10, phase detector 15, phase synthesizer 20 and delay line 25. While delay line 25 may be formed using analog components, in a digital circuit-based fabrication process, it is desirable to use a digital-based delay line. The figure illustrates a digital delay line (DDL) 25. To aid in the understanding of the invention, an overview of the embodiment is given below.

OS block 10 over-samples the incoming digital data stream (shown as Rx signal input) using N (N≥2) phase clocks. The N sampled data are re-aligned to the local reference clock to provide N re-timed parallel data, which is the same incoming data with (T/N) delays in the clock cycle (T). The phase error of the detected data transition (i.e., the phase difference between the data transition and the local reference clock) is determined from the over-sampled data. In this figure, phase detector 15 is shown to detect the data transition. The re-timed data and the phase error are then fed into the data and control path of data recovery circuit 5. Phase synthesizer 20 synthesizes the incoming data phase error from the transition phase error and the previous data phase error based on a sigma delta modulation algorithm. The synthesized in-cycle and multi-cycle data phase errors may be stored in an N-bit in-cycle phase (ICP) error register and an M-bit multi-cycle phase (MCP) error register. This allows DDL 25 to have a tracking range of M clock cycles with a 1/N clock cycle resolution.

According to one embodiment, DDL 25 comprises an N-to-1 digital MUX and a variable length first-in-first-out (FIFO) register with fixed output port. The fine or in-cycle phase error of the incoming data is compensated by selecting the corresponding N re-timed data from the output of the OS block 10 using the MUX according to the value of the ICP register. The coarse or multi-cycle data phase error may be compensated by adjusting the length of the FIFO according to the value of the MCP register. Further details of the above scheme will now be described in more detail in the passages below.

Figure 2:
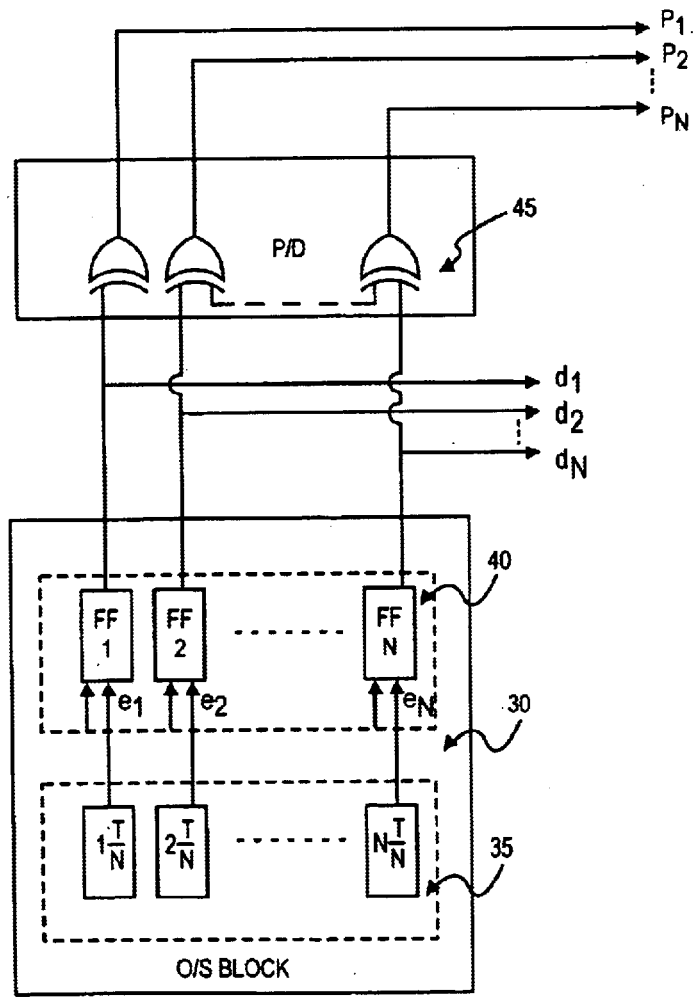
FIG. 2 is a schematic diagram of an over-sampling block and a phase detector in accordance with an embodiment of the invention.
Figure 3:
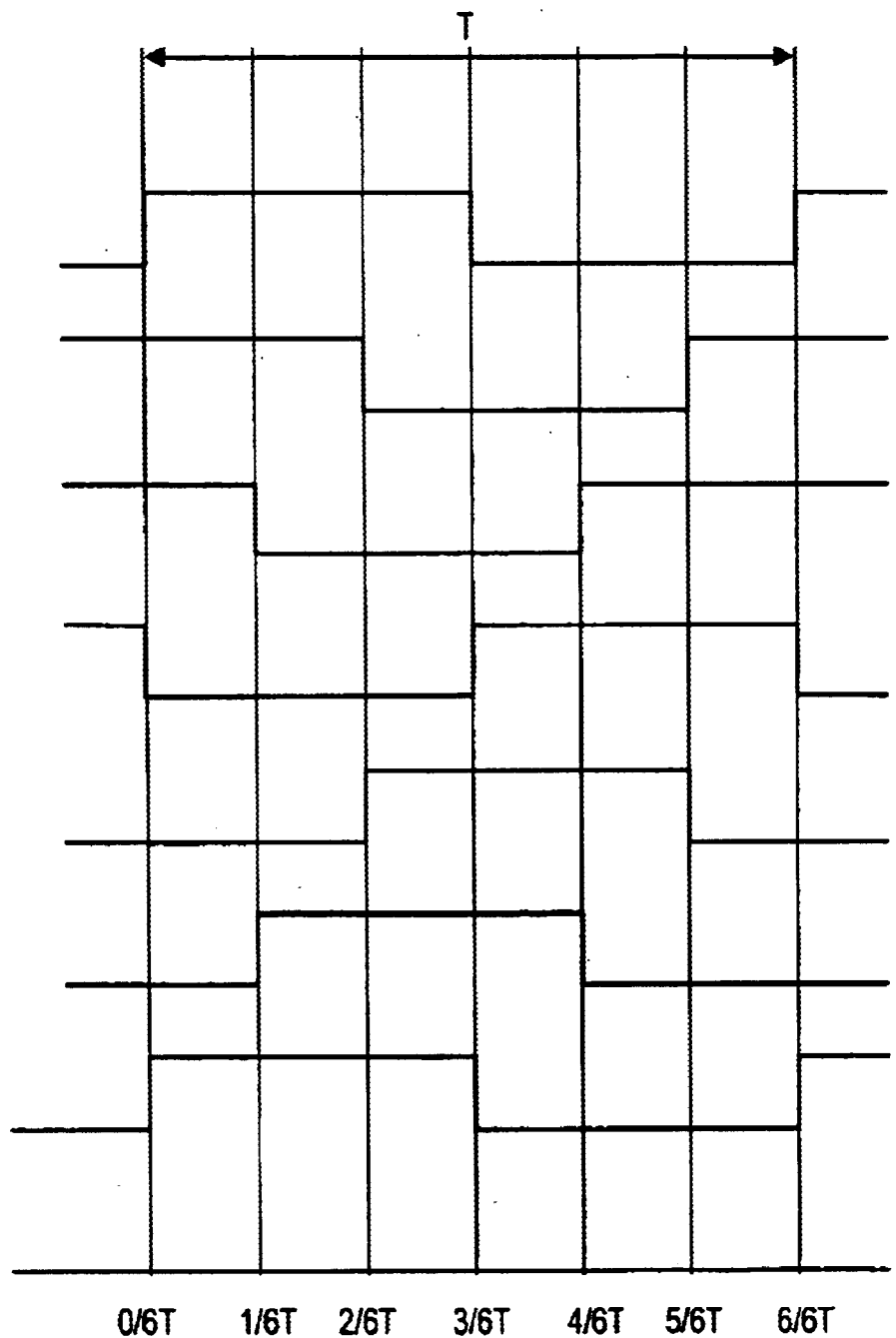
FIG. 3 illustrates an over-sampling clock timing diagram in which the local reference clock is phase shifted 6 times by 1/6 T to form 6 equally-spaced clocks in one local reference clock cycle in accordance with an embodiment of the invention.

FIG. 2 is a schematic diagram of over-sampling (OS) block 30 and phase detector 45 in accordance with an embodiment of the invention. The incoming data is over-sampled using N (N>2) phase clocks. FIG. 3 illustrates an over-sampling clock timing diagram in which the local reference clock (e.g., the data recovery circuit clock) is phase shifted 6 times by 1/6 T (where T is one clock cycle of the local reference clock) to form 6 clocks (i.e., N=6) in one local reference clock cycle. One of the edges (e.g., rising edge) of the clocks are used as sampling points e1 . . . e2 and e6 to sample the incoming data. During each of its clocks samples of the incoming data are taken to provide the over-sampling of incoming data. Because N (in this example, N=6) sampling points correspond to a single local reference clock cycle, the sampled data is re-timed to the local reference clock. Referring back to FIG. 2, the phase shift into N clocks may be performed by delay line 35 or other equivalents. The N clocks are used as triggers to the respective N number of flip-flops 40. Each flip-flop is triggered by the rising edge of one of the N clocks. The incoming data line is coupled to the input of the flip-flops 40 which is sampled by the flip flops to be outputted as sampled data d1, d2, . . . dN.

Figure 4:
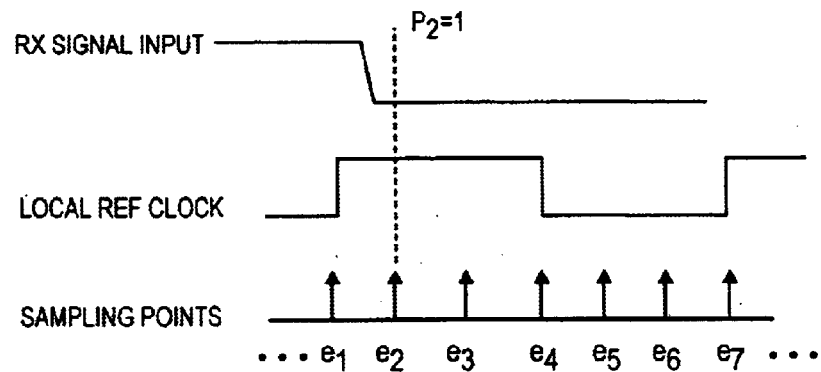
FIG. 4 illustrates the case where a phase transition has been detected between sampling points e1 and e2, which will be communicated to the phase synthesizer in a form of signal $P_2$ in accordance with an embodiment of the invention.

Sampled data d1, d2, . . . dN is used by phase detector 45 to determine the phase transition of the incoming data. According to one embodiment, phase detector 45 comprises a plurality of Exclusive-OR (XOR) gates. An XOR function is performed on one sampled data and the immediate sampled data. If there is a data transition between the two sampled data, the corresponding XOR gate outputs a signal to acknowledge the data transition. For example, as shown in FIG. 4, between the sampling points e1 and e2 a phase transition has been detected, which will be communicated to the phase synthesizer in a form of signal p2.

Figure 5:
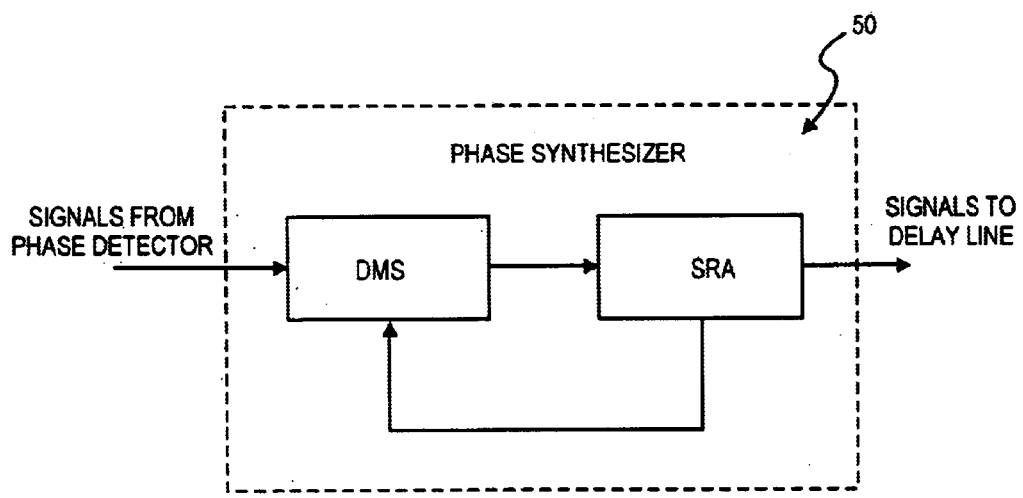
FIG. 5 is a block diagram of a phase synthesizer in accordance with an embodiment of the invention.
Figure 6:
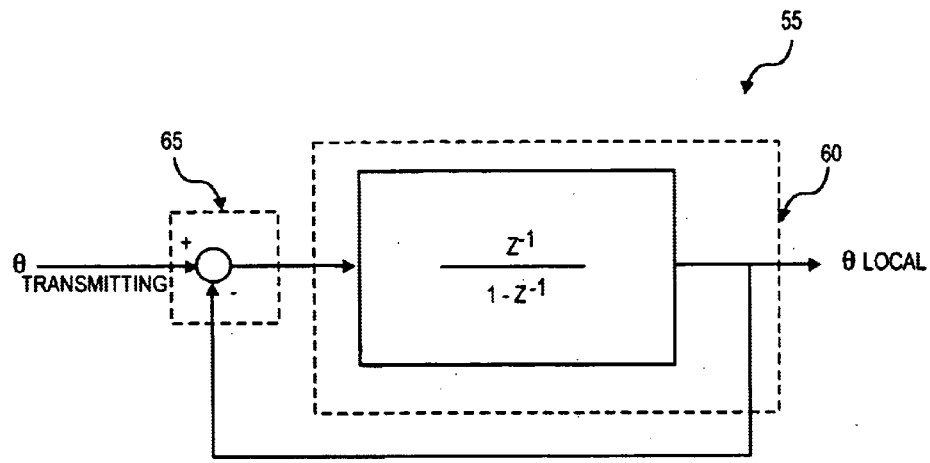
FIG. 6 illustrates a sigma-delta modulator in accordance with an embodiment of the invention.
Figure 7:
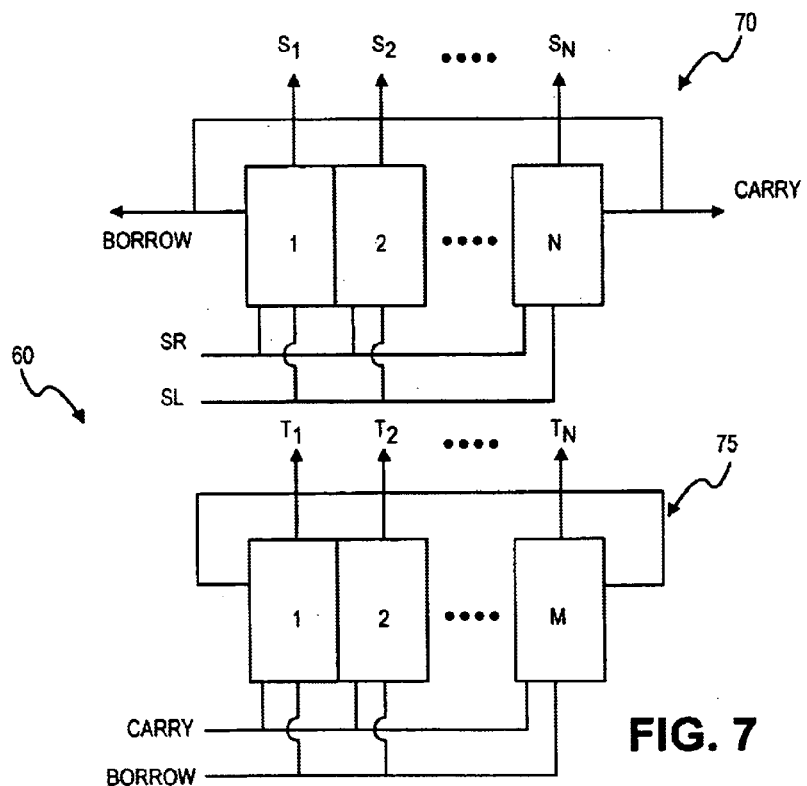
FIG. 7 illustrates a Shift Register Accumulator (SRA) in accordance with an embodiment of the invention.

FIG. 5 is a block diagram of phase synthesizer 50 in accordance with:an embodiment of the invention. According to the embodiment, the phase synthesizer 50 synthesizes the incoming data phase error from the detected phase transition (from the phase detector) and the previously stored data phase error (in the shift registers to be described below) based on a digital sigma-delta modulator algorithm. FIG. 6 illustrates a sigma-delta modulator 55 in accordance with an embodiment of the invention. Sigma-delta modulator 55 according to one embodiment comprises Shift Register Accumulator SRA 60 and Decision Matrix Subtractor DMS 65. FIG. 7 illustrates Shift Register Accumulator SRA 60 in accordance with an embodiment of the invention. SRA 60 comprises two shift registers 70, 75, that are used as counters to store the values of the synthesized in-cycle phase (ICP) and multi-cycle phase (MCP). The ICP shift register 70 comprises N bits which track phase error within a cycle of the local clock, for example. According to the embodiment, the N bits correspond to the number of sampling points used in the OS block. The number of sampling points and N bits of ICP shift register 70 may be selected according to a desired result, however, the greater the value N, a more refined tuning of the in-cycle phase error may be performed. MCP shift register 75 comprises M bits, which track the phase error according to a number of clock cycles. Stated differently, MCP shift register 75 determines the phase error in M clock cycles. MCP shift register 75 and ICP shift clock register 70 allows the Delay Locked Loop (DLL) to have a phase error tracking range of M clock cycles with 1/N clock cycle resolution. The shift operations of ICP shift register 70 and MCP shift register 75 are performed by Shift Right (SR) operation for phase lag and Shift Left (SL) operation for phase lead. The SR and the SL operations are determined by a DMS, which will be described with reference to FIG. 8.

The operation of ICP register 70 and MCP register 75 are now described. According to one embodiment, when the data recovery circuit is powered up, perhaps through a wake up mode, ICP register 70 and MCP register 75 store pre-defined values that may be approximately in phase with the incoming data. Dependent on the SR and SL commands received from the DMS, ICP register 70 shifts an enabling bit to the right or left respectively. The enabling bit enables one of the signals, S1, S2 . . . SN. The enabled signal S1, S2 . . . SN of ICP register 70 determines the delay duration at the delay line as will be apparent with respect to FIG. 9. If ICP register 70 reaches one end (i.e., the least significant bit (LSB), or the most significant bit (MSB), of the register without syncing with the incoming data, an overflow (e.g., carry) or an underflow (e.g., borrow) is transmitted to MCCP register 75.

If MCP register 75 receives a carry signal, MCP register 75 increments by one bit to indicate that the incoming data has one cycle lead over the local clock. Conversely, if MCP register 75 receives a borrow signal from ICP register 70, MCP register 75 decrements by one bit to indicate that the incoming data has one cycle lag over the local clock. The enabling bit of MCP register 75 enables one of the signals t1, t2 . . . tM that determines a delay duration of the delay line as will be apparent in FIG. 12. Once MCCP register 75 has incremented or decremented by one bit, ICP register 70 shifts the enabling bit again, according to the SR and SL signals. The process resumes until SRA 70 syncs with the incoming data.

Figure 8:
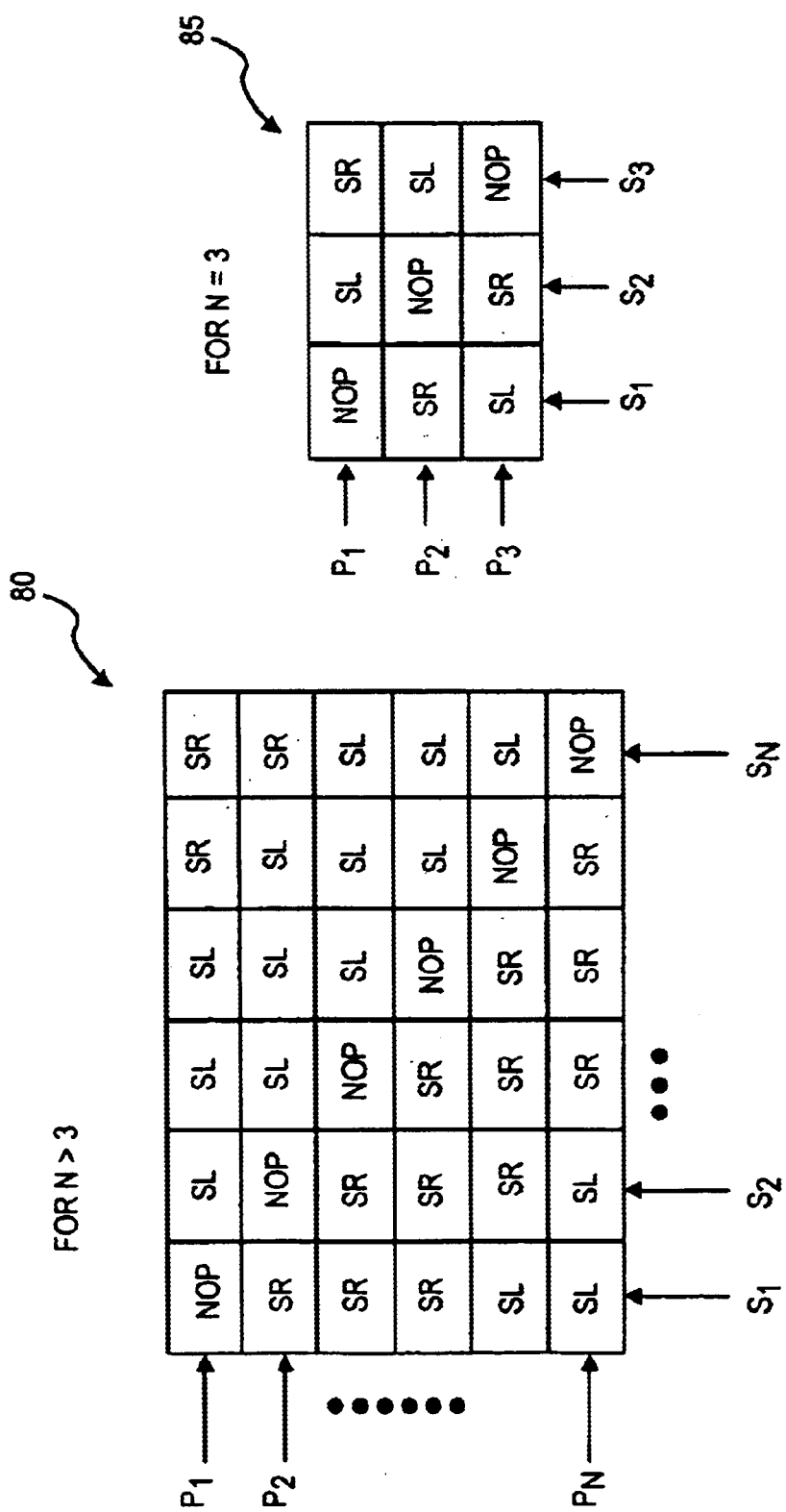
FIG. 8 illustrates two logic diagrams of a Decision Matrix Subtractor (DMS), the first where N>3 and the second where N=3.

FIG. 8 is a logical diagram of a decision matrix subtractor DMS 80 for N>3 and DMS 85 for N=3, in accordance with one embodiment of the invention. DMS 80 contains possible combinations obtained by the intersection of a detected transition phase (i.e., p1, p2, p3 . . . pN) and a synthesized in-cycle phase (i.e., s1, s2, s3 . . . sN) and affects the previously stored value in ICP shift register 70 (see FIG. 7). As illustrated, there are a plurality of operations designated as no operations (NOP), shift right (SR), and shift left (SL) stored within the matrix. The ICP shift register 70 operates dependent on the selected operation. The number of rows in the N-dimensional matrix are determined by the signals obtained from the phase detector ($P_1 P_2 \ldots P_N$). The number of columns in the n-dimensional matrix are determined by the enabled signals obtained from the enabling bit in ICP register 70, in the previous state. Because a 3-dimensional matrix involves a special case, it can be represented by DMS 85. For all other cases, where N>3, DMS 80 can be used.

Figure 9:
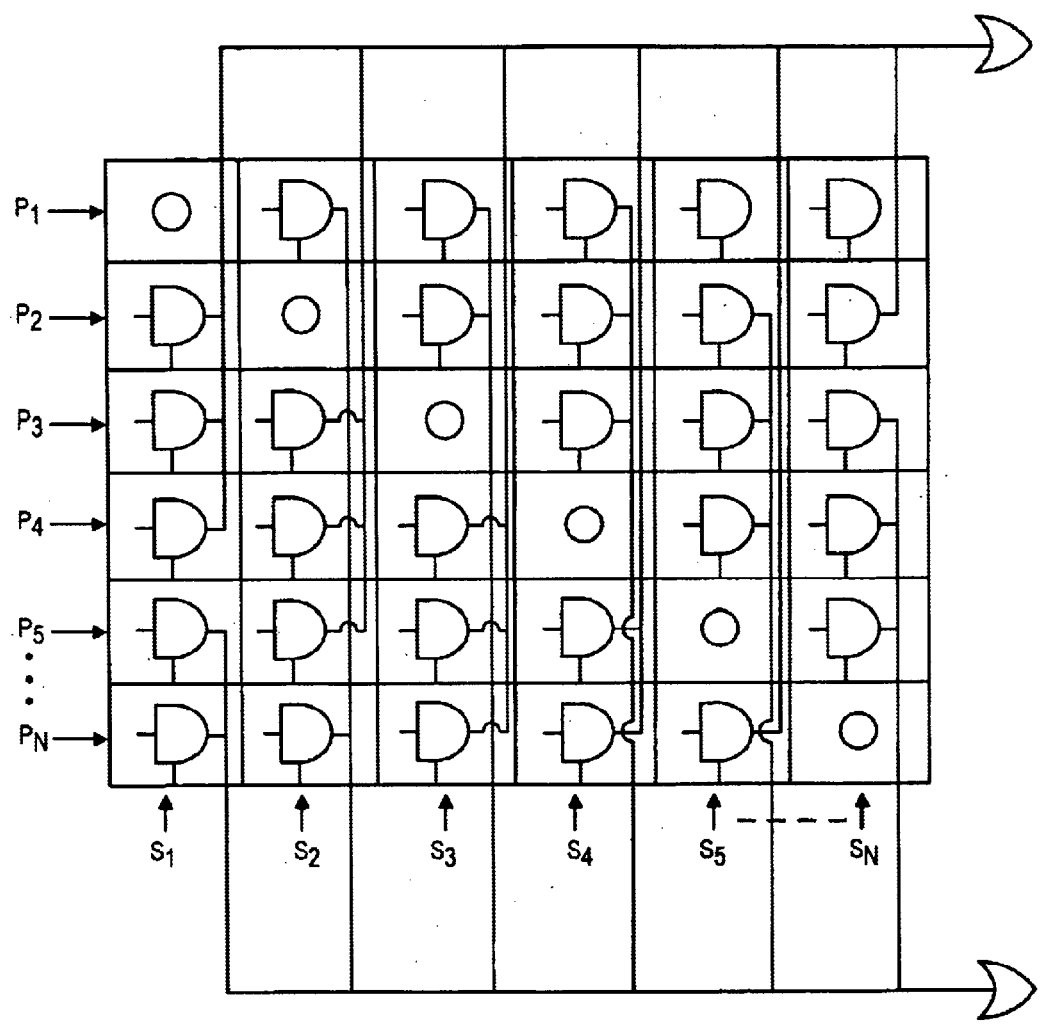
FIG. 9 illustrates a Decision Matrix Subtractor (DMS), where the no operation (NOP) commands are represented by "O"'s and the shift-right (SR) and shift-left (SL) commands are represented by AND and OR gates.

Denoting the subscript for P signals as $X(P_X)$ and for S signals as $Y(S_y)$, it is possible to fill in the matrix with either 3 different operations (SR, SL or NOP). FIG. 9 illustrates a DMS where the no operation (NOP) commands are represented by "O"'s and the shift-right (SR) and shift-left (SL) commands are represented by AND and OR gates. Thus no operation will be performed in the ICP register 70, since both signals are said to be in phase or synchronized as no transition was detected. The shift-left (SL) operations can be represented and performed using AND gates connected to one another, where an OR gate is finally connected to its output. In such a manner, if the proper position for shift-left (SL) operation is detected, the enabling bit of the previous state in the ICP register 70 will be shifted to the left until a no operation command is generated, so that it may be in phase or synchronized with the signal obtained from the phase detector.

Shift-right (SR) operations can be represented and performed, again using AND gates connected to one another, where an OR gate is finally connected to its output. In such a manner, if the proper position for shift-right (SR) operation is detected, the enabling bit of the previous state in the ICP register 70 will be shifted to the right, so that it may be in phase or synchronized with the signal obtained from the phase detector.

As an example, if the detected transition phase is p2 and the previously stored bit in ICP shift register 70 is s1, the DMS transmits an SR signal to ICP shift register 70. ICP shift register 70 shifts right one bit or s2. If the transition phase remains at p2, then no signal is generated by DMS because the detected transition phase p2 and the synthesized in-cycle phase s2 are in sync. Similarly, if the detected transition phase is p2 and the synthesized in-cycle phase is sN, DMS transmits a SR to ICP shift register 70. Because the bit sN is the MSB in the ICP shift register 70, a carry signal is transmitted to MCP shift register 74, which increments one bit to indicate a next cycle. ICP shift register 70 re-counts as s1. If the detected transition phase is at p2, because the in-cycle phase is at s1, DMS transmits a SR signal to the ICP shift register 70. The ICP shift register increments one bit to reflect s2. If the detected transition phase is at p2, no further operation is transmitted by DMS because the detected transition phase and the synthesized in-cycle phase are in sync.

Figure 10:
FIG. 10 illustrates the example where the AND gate detects a shift-left (SL) operation and a borrow signal is in turn transmitted to the multi-cycle phase (MCP) register in accordance with an embodiment of the invention.
Figure 11:
FIG. 11 illustrates the example where the AND gate detects a shift-right (SR) operation and a carry signal is in turn transmitted to the multi-cycle phase (MCP) register in accordance with an embodiment of the invention.

In the preceding DMS matrix, when x=1 and y=N, a carry signal is found. Also in the preceding DMS matrix, when x=N and y=1, a borrow signal is found. Both an overflow (e.g., carry) or an underflow (e.g., borrow) can be represented by AND gates. For example, as shown in FIG. 10, in the case of a borrow signal, if the previous state was 100 and the next state was 001, the AND gate would detect a shift-left operation and a borrow signal would in turn be transmitted to MCP register 75. Also, for example, as shown in FIG. 11, in the case of a carry signal if the previous state was 001 and the next state was 100, the AND gate would detect a shift-right operation and a carry signal would in turn be transmitted to MCP register 75.

It should also be noted that in the preceding DMS matrix, when x=1 and y=N, up to 2 operations can be performed, that is a shift-right (SR) for FDDL 95 and a shiftright (SR) for CDDL 100-if there is a carry signal. Thus, 2 bits of data may be transmitted to MCP register 75. As well, when x=N and y=1, up to 2 operations can be performed, that is a shift-left (SL) for FDDL and a shift-left (SL) for CDDL if there is a borrow signal. Thus, two bits of data may be transmitted to MCP register 75.

Figure 12:
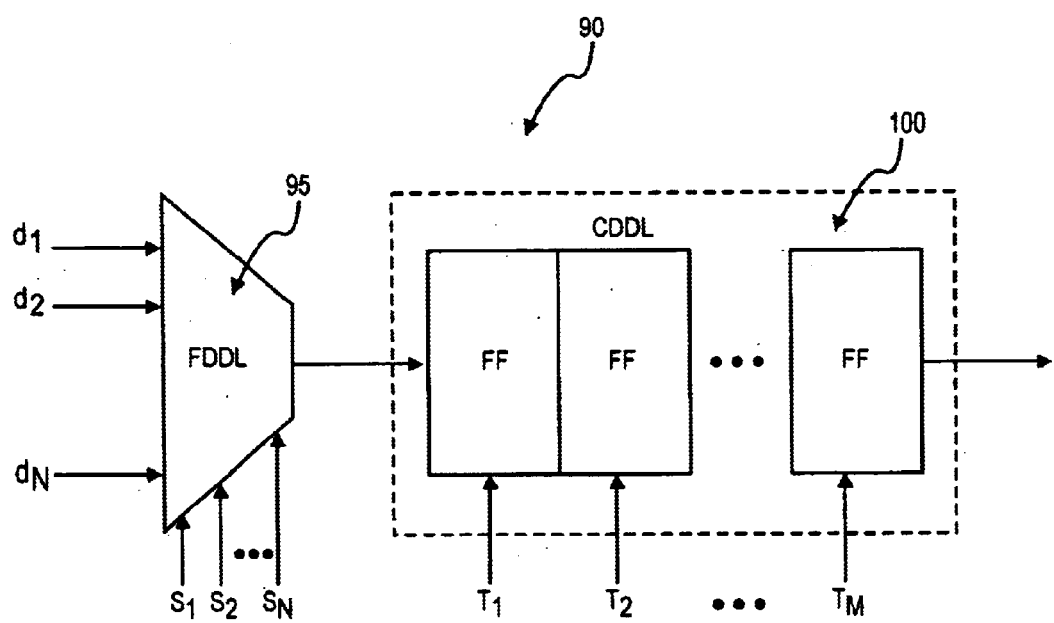
FIG. 12 is a schematic diagram of a delay line in accordance with an embodiment of the invention.

FIG. 12 is a schematic diagram of a delay line in accordance with an embodiment of the invention. In this figure, a Digital Delay Line (DDL) is contemplated although an Analog Delay Line may be used according to a desired result. DDL 90 comprises Fine Digital Delay Line FDDL 95 and Coarse Digital Delay Line CDDL 100. The delay duration of FDDL 95 is controlled by ICP shift register 70 (see FIG. 7) by signals s1, s2 . . . sN. Conversely, the delay duration of CDDL 100 is controlled by the MCP shift register 75 by signals t1, t2 . . . tN. FDDL 95 compensates the phase difference between the transition and the local clock that occurs within the local clock cycle. CDDL 100 compensates the phase difference between the transition and the local clock where the difference is a multiple of local clock cycles.

Referring to the figure, in one embodiment, FDDL 95 is a N-to-1 digital MUX that selects one of the data stream d1, d2 . . . dN according to one of the signals, s1, s2 . . . sN enabled by ICP register 70. In that manner, ICP register 70 selects the optimal data stream that has been compensated for the phase error. CDDL 100 according to one embodiment, is a first-in-first-out register (FIFO), which may be formed by a plurality of flip-flops (FFs). Each enabled flip-flop delays the data stream by one local clock cycle. The number of local clock cycle delays is determined by t1, t2 . . . tM signals enabled by MCP register 75. Thus, if ICP shift register 70 has N bits, and the MCP shift register 75 has M bits, DDL 90 will, generally, be designed to have a phase error tracking range of M clock cycles with 1/N clock cycle resolution. DDL 90 generally compensates the phase difference by delaying the incoming data until the incoming data is in sync with the local reference clock.

Figure 13:
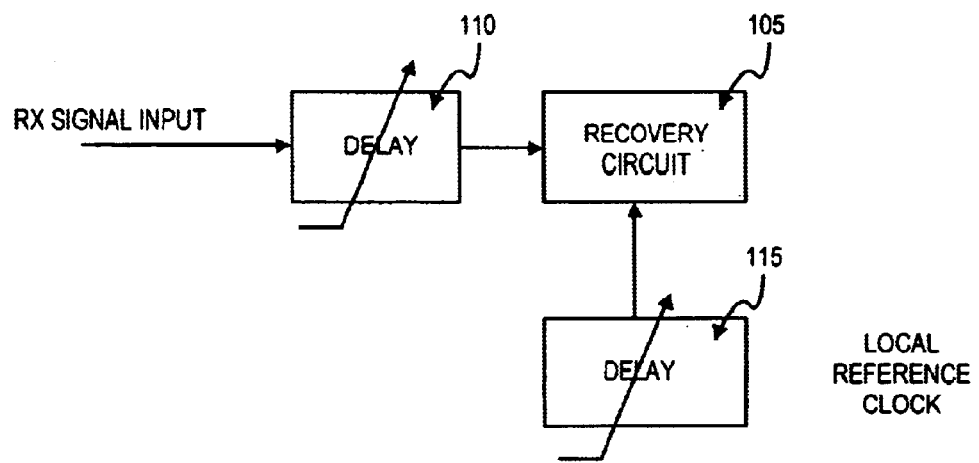
FIG. 13 is a schematic diagram that illustrates two general approaches to synchronizing a transmitting clock in a transmitting circuit and a receiving clock in a receiving circuit as to allow transfer between the two circuits in accordance with an embodiment of the invention.

FIG. 13 is a schematic diagram that illustrates two general approaches to synchronizing a transmitting clock in a transmitting circuit, and a receiving clock in recovery circuit 105, as to allow data transfer between the two circuits. In one approach, the local clock may be variably delayed by variable delay device 110 until the local clock is in sync with the incoming data ($R_x$ signal input). This approach is generally used by PLL-based schemes where the variable delay device 110 is a voltage-controlled oscillator. In the second approach, the incoming data is variably delayed by variable delay device 115 until the incoming data is in sync with the local clock. This approach is generally used by DLL-based scheme where variable delay device 115 is on delay line such as DDL 90 described in FIG. 12.

Figure 14:
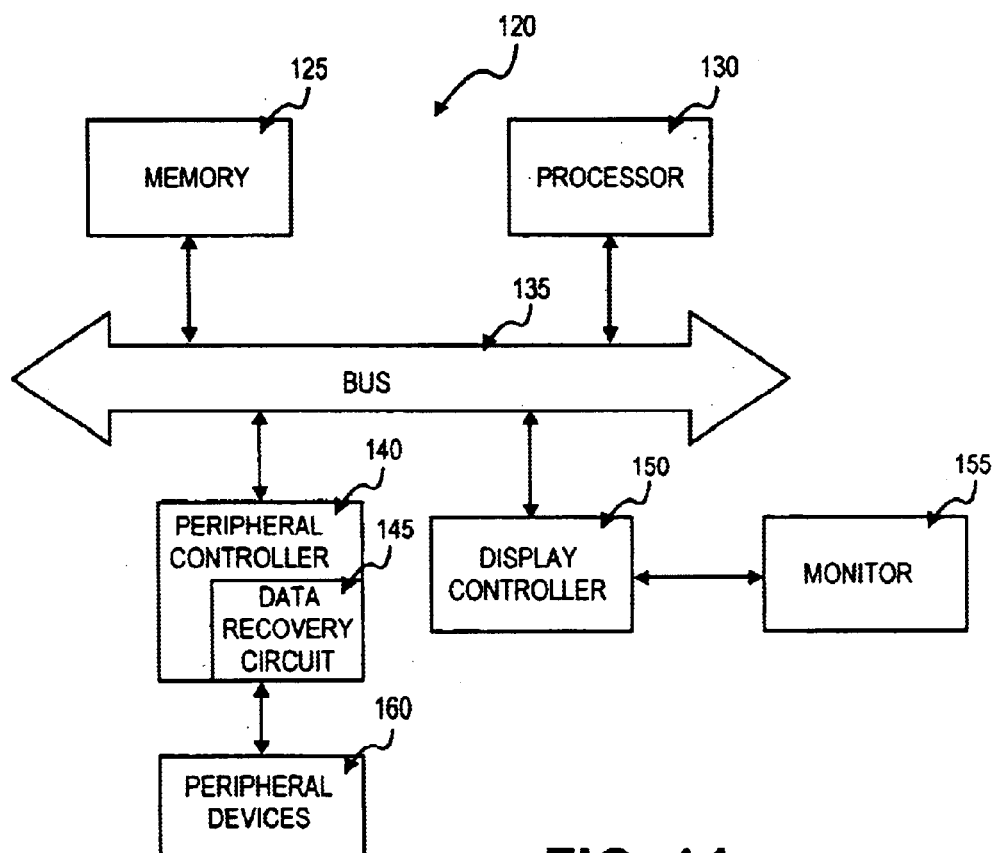
FIG. 14 is a schematic diagram of a system wherein a peripheral controller comprises a data recovery circuit and is coupled to a processor that is adapted to access data from the peripheral controller in accordance with an embodiment of the invention.

FIG. 14 is a schematic diagram that illustrates a system 120 wherein a peripheral controller 140 comprises a data recovery circuit 145. Peripheral controller 140 is coupled to processor 130 via a serial or parallel bus 135. Processor 130 is adapted to access data from peripheral controller 140 via bus 135.

Memory 125, and display controller 150, may also be coupled to peripheral controller 140 via bus 135. Monitor 155 may also be coupled to display controller 150. And, other peripheral devices 160, such as a mouse, CD-ROM and video, may also be coupled to peripheral controller 140.

FIG. 14 illustrates but one application of the invention, that is the personal computer but may be replaced by other applications such as a workstation, server, Internet driver or other fabric channels used as a link.

The invention has been described with respect to various embodiments. The invention allows for data recovery with various over-sampling rates and multi-level digital signal inputs. The multi-level digital data sampling capability may be used for multi-level digital data communication and equalization. According to one embodiment, this may be implemented using a programmable phase synthesizer implemented as a programmable SRA and a programmable DMS. The invention allows for data communication circuits to be designed using DLL instead of PLL. Circuit implementation of the described data recovery scheme above has yielded a size of less than 25% and lower power dissipation when compared with a conventional PLL-based scheme. When a digital DLL is used, a single digital fabrication process may be used because the circuit to be fabricated is mainly digital, better testability, scalability, and manufacturability may be obtained.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A system comprising:
    a processor; and
    a peripheral controller coupled to the processor, the processor adapted to access data from the peripheral controller, the peripheral controller comprising a data recovery circuit, the data recovery circuit having a sampling circuit to generate sampling clocks from a local clock of the system, the sampling clocks to sample incoming data, a phase detector to detect a data transition in the sampled data, a phase synthesizer to generate a predicted phase based on the detected data transition, and a delay line to delay the sampled data in accordance with the predicted phase.

2. The system of claim 1, wherein the phase detector comprises a plurality of Exclusive-OR (XOR) gates, to perform a function on a plurality of sampled data and to provide a signal that acknowledges a data transition between two sampled data.

3. The system of claim 1, wherein the sampling circuit is an oversampling circuit to oversample incoming data using N (N>=2) clocks and the delay between two clocks is T/N where T is a local clock cycle and N is a real number.

4. A data recovery circuit comprising:
    an oversampling block to generate a plurality of sampling signals from a local reference clock, to sample an incoming data signal that contains a plurality of data symbols;
    a phase detector having an input coupled to an output of the oversampling block, the detector to detect a plurality of transitions of the serial data signal based on a plurality of samples of the incoming serial data signal;
    a phase synthesizer having an input coupled to an output of the phase detector, the synthesizer to predict a phase of each of the plurality of data symbols in the incoming data signal; and
    a variable delay line having a control input coupled to an output of the phase synthesizer, a further input coupled to an output of the oversampling block, and an output to provide the plurality of data symbols through a variable delay,
    wherein the synthesizer is to control the delay line in accordance with the predicted phase.

5. The data recovery circuit of claim 4 wherein the synthesizer is to store in-cycle phase and multi-cycle phase information, the in-cycle phase information refers to phase errors, between the serial data signal and the predicted phase, that are shorter than a single period of the local clock, and the multi-cycle phase information refers to phase errors that are longer than a single period of the local clock.

6. The data recovery circuit of claim 5 wherein the variable delay line has a coarse delay portion and a fine delay portion, the coarse delay portion to be adjusted according to the multi-cycle phase information and the fine delay portion to be adjusted according to the in-cycle phase information.

7. The data recovery circuit of claim 4 wherein the variable delay line has an input that is coupled to the oversampling block to receive the plurality of samples of the incoming serial data signal.

8. The data recovery circuit of claim 4 wherein the phase detector is to detect a transition between adjacent samples of the incoming serial data signal.

9. The data recovery circuit of claim 8 wherein the oversampling block is to sample at a rate that is N times the frequency of the local clock, where N is greater than one.

10. The data recovery circuit of claim 4 wherein the phase synthesizer comprises a decision matrix subtractor (DMS) having inputs to receive a detected phase and a predicted phase, and a shift register accumulator (SRA).

11. The data recovery circuit of claim 10 wherein the DMS is to generate a predetermined command, being one of shift right, shift left, and no operation, to the SRA, the SRA having a first shift register to contain a first bit which controls the amount of delay in the delay line.

12. The data recovery circuit of claim 11 wherein the SRA has a second shift register, and wherein an underflow or an overflow in the first register causes a second bit of the second register to be shifted.

13. The data recovery circuit of claim 12 wherein the delay line comprises:

a first delay line and a second delay line, wherein the first delay line is to delay the sampled data up to one local clock cycle and the second delay line is to delay the sampled data by more than one local clock cycle, the first shift register is to control the delay of the first delay line and the second shift register to control the delay of the second delay line.

14. The data recovery circuit of claim 13 wherein the first delay line is an N-to-1 MUX that selects one of a plurality of sampled data d1, d2 . . . dN according to one of signals, S1, S2 . . . SN enabled by the first shift register.

15. The data recovery circuit of claim 14 wherein the second delay line is a plurality of flip-flops (FFs), wherein each flip-flop when enabled delays the plurality of sampled data by one local clock cycle and the number of local clock cycle delays is determined by signals T1, T2 . . . TM enabled by the second register.

16. A method for recovering data, comprising:

detecting transitions in an incoming serial data signal that contains a sequence of data symbols, by oversampling the incoming serial data signal based on a local reference clock signal;

determining a phase error between a detected transition of the incoming serial data signal and a predicted phase of the incoming serial data signal wherein the phase error is determined using a decision matrix of mxm elements, wherein m is an integer greater than one, which contain combinations of detected transition phase and predicted phase; and changing a timing of a sequence of recovered data symbols according to the phase error.

17. The method of claim 16 wherein the oversampling is at a rate that is an integer multiple of a frequency of the local reference clock signal.

18. The method of claim 17 further comprising generating the predicted phase of the incoming serial data signal using a sigma-delta modulation algorithm.

19. A method for data recovery comprising:

sampling a data signal based on a local reference clock, to obtain a plurality of samples of each symbol period in the data signal;

detecting a data transition in the data signal using the plurality of samples;

synthesizing a phase based on the detected data transition using a sigma-delta modulation algorithm implemented by (a) a decision matrix subtractor (DMS) that operates based on the data transition as an input, and (b) a shift register accumulator (SRA) controlled by the DMS and whose output is used to derive the phase; and delaying the plurality of samples in accordance with the synthesized phase.

20. The method of claim 19 wherein the data transition is detected using a plurality of sampling signals derived from the local reference clock.

21. A method for data recovery comprising:

sampling a data signal based on a local reference clock, to obtain a plurality of samples of each symbol period in the data signal;

detecting a data transition in the data signal using the plurality of samples;

synthesizing a phase based on the detected data transition wherein the phase is synthesized by configuring a shift register with an output bit pattern that will represent the synthesized phase, and applying a shift left, a shift right, and don't shift commands to the shift register based on a plurality of combinations of a detected data transition and a synthesized phase; and delaying the plurality of samples in accordance with the synthesized phase by applying the output bit pattern of the shift register to a delay line.

* * * * *

UNITED STATES PATENT AND TRADEMARK OFFICE
CERTIFICATE OF CORRECTION

PATENT NO. : 6,775,345 B1
DATED : August 10, 2004
INVENTOR(S) : Song

It is certified that error appears in the above-identified patent and that said Letters Patent is hereby corrected as shown below:

Column 4,
Line 51, after "with", delete ":".

Column 5,
Lines 31 and 40, delete "MCCP" and insert -- MCP --.

Signed and Sealed this

Thirtieth Day of November, 2004

JON W. DUDAS
*Director of the United States Patent and Trademark Office*